United States Patent [19]
Sung

[11] Patent Number: 5,753,551
[45] Date of Patent: May 19, 1998

[54] MEMORY CELL ARRAY WITH A SELF-ALIGNED, BURIED BIT LINE

[75] Inventor: JanMye Sung, Yang-Mei, Taiwan

[73] Assignee: Vanguard International Semiconductor Corporation

[21] Appl. No.: 756,088

[22] Filed: Nov. 25, 1996

[51] Int. Cl.⁶ .............................................. H01L 21/8242
[52] U.S. Cl. ...................... 438/253; 438/244; 438/564; 438/675
[58] Field of Search ............................ 438/244, 253, 438/387, 396, 564, 674, 675

[56] References Cited

U.S. PATENT DOCUMENTS

| | | | |
|---|---|---|---|
| 5,156,993 | 10/1992 | Su | 438/244 |
| 5,250,457 | 10/1993 | Dennison | 437/48 |
| 5,364,808 | 11/1994 | Yang et al. | 437/47 |
| 5,369,048 | 11/1994 | Hsue | 437/52 |
| 5,438,009 | 8/1995 | Yang et al. | 438/253 |
| 5,441,908 | 8/1995 | Lee et al. | 438/253 |

*Primary Examiner*—Chandra Chaudhari
*Attorney, Agent, or Firm*—George O. Saile; Stephen B. Ackerman

[57] ABSTRACT

A method for forming memory cells, featuring a bit line, embedded in an insulator filled, shallow trench, has been developed. Self-alignment of the buried bit line, to a source and drain region of a transfer gate transistor, is obtained via outdiffusion of a doped polysilicon layer, used as part of the buried bit line, composite layer.

25 Claims, 6 Drawing Sheets

MEMORY CELL ARRAY WITH A SELF-ALIGNED, BURIED BIT LINE

BACKGROUND OF THE INVENTION

(1) Field of the Invention

The present invention relates to a method used to fabricate a high density, semiconductor, memory cell, with a stacked capacitor structure which overlays a cell transistor, with the cell transistor containing a buried bit line structure which is self-aligned to the cell transistor.

(2) Description of the Prior Art

Device performance and cost reductions are major objectives of the semiconductor industry. These objectives have been successfully addressed by the ability of the semiconductor industry to produce devices with sub-micron features, or micro-miniaturization. Smaller features allow the reduction in performance degrading capacitances and resistances to be realized. In addition smaller features result in a smaller chip, however maintaining the same level of integration that is acquired for semiconductor chips fabricated with larger features. This allows a greater number of the denser, smaller chips to be obtained from a specific size starting substrate, thus resulting in a lower manufacturing cost for an individual chip.

The use of smaller features, has been extensively used in the fabrication of dynamic random access memory, (DRAM), devices, in which the capacitor of the DRAM device is a stacked capacitor, (STC), structure. A DRAM cell is usually comprised of the STC structure, overlying a transfer gate transistor, and connected to the source or drain of the transfer gate transistor. The bit line of the DRAM cell is usually comprised of a metal line, traversing a passivating insulator layer, and contacting a source and drain region, of the transfer gate transistor, via a contact hole in the passivating insulator layer. One method of minimizing the amount of area the bit line, of the DRAM device, occupies, is a buried bit line concept. Several inventions suggesting buried bit line concepts, for DRAM devices, have been disclosed. Dennison, in U.S. Pat. No. 5,250,457, as well as Yang, et al, in U.S. Pat. No. 5,364,808, have provided methods for fabricating a buried bit line, to active areas, source and drain regions, of a transfer gate transistor. However these inventions require tightly spaced bit lines, overlying the active source and drain regions, and printed over a highly topographical insulator surface, requiring a large depth of focus exposure, which can be difficult to control. In addition close packed bit lines can result in an increase undesirable bit line to bit line coupling capacitance.

This invention will describe a process in which a buried bit line is totally embedded in an isolating oxide shape, either shallow trench, or field oxide isolation, thus not occupying additional area of the memory cell, and not having to traverse severe topographies, thus allowing density improvements to be realized. In addition the buried bit line of this invention features self-alignment to the source and drain region of the transfer gate transistor, via contact of the embedded bit line, to the sides of the adjacent source and drain region.

SUMMARY OF THE INVENTION

It is an object of this invention to create a DRAM memory cell, in which a STC structure overlies a buried bit line.

It is another object of this invention to embed the buried bit line in a field oxide region, or in an insulator filled, shallow trench region, reducing the topography problems encountered with bit lines traversing passivating insulator layers, overlying source and drain regions.

It is yet another object of this invention to self-align the buried bit line to an adjacent source and drain region.

It is still yet another object of this invention to connect and contact the self-aligned, buried bit line, to the source and drain region, of a transfer gate transistor, via outdiffusion from a doped polysilicon layer, used as part of the buried bit line, embedded in an insulator filled, shallow trench.

In accordance with the present invention a method of creating a memory cell, with a buried bit line, self-aligned to a source and drain region, is described. Shallow trenches, filled with insulator are initially formed, for isolation purposes. Photolithographic and dry etching procedures are employed to remove a portion of insulator from a corner of an insulator filled, shallow trench, creating a notch, in the corner of the insulator filled, shallow trench. Conductive layers of doped polysilicon, and metal, or metal silicide, are deposited, completely filling the notch in the shallow trench, where insulator had been removed, while also covering the top surface of the semiconductor substrate, comprised of insulator filled, shallow trenches, and the spaces between trenches. Etchback procedures are next employed to remove the conductive layers from the top surface of the semiconductor substrate, and continued to recess the conductive layers, in the notch, located in the corner of the insulator filled, shallow trench, to a level in which the metal, or metal silicide layer, and the doped polysilicon layer, are recessed below the top surface of the semiconductor substrate. Another insulator layer is next deposited, and patterned to completely cover the conductive layers, recessed in the notch, and to fill the notch, located in the corner of the insulator filled, shallow trench. A gate insulator layer is thermally grown, and a polysilicon gate structure is formed in the region of the memory cell to be used for the transfer gate transistor. A lightly doped source and drain region is next formed in an area of the transfer gate transistor, not covered by the polysilicon gate structure. After creation of insulator spacers, on the sides of the polysilicon gate structure, a heavily doped source and drain region is formed, again in the area not covered by polysilicon gate structures. Annealing procedures, used to activate the dopants in the source and drain region, result in outdiffusion of dopant from the doped polysilicon layer, in the notch, located in the corner of the insulator filled, shallow trench, connecting the adjacent heavily doped source and drain region, to the buried bit line, and thus providing electrical contact between the source and drain region, of the transfer gate transistor, and the buried bit line, embedded in the insulator filled, shallow trench. Another insulator layer is deposited and a capacitor contact hole is opened to a source and drain region of the transfer gate transistor, to allow contact for a subsequent storage node structure to be made. After formation of the storage node structure, another insulator layer is deposited, and contact holes are again opened to a source and drain region, which is electrically connected to the buried bit line. Metallization and patterning, to create the contact to the buried bit line, are then performed.

BRIEF DESCRIPTION OF THE DRAWINGS

The object and other advantages of this invention are best described in the preferred embodiments with reference to the attached drawings that include:

FIGS. 2a–7a, which in cross-sectional style, for one specific direction of the memory cell, along the AA' axis, illustrates the key fabrication stages used to create the bit line, embedded in insulator, and self aligned to a source and drain region.

FIGS. 8a–9a, which in cross-sectional style, illustrate the key stages of fabrication of the STC structure, of the memory cell.

DESCRIPTION OF THE PREFERRED EMBODIMENTS

Figure 1:
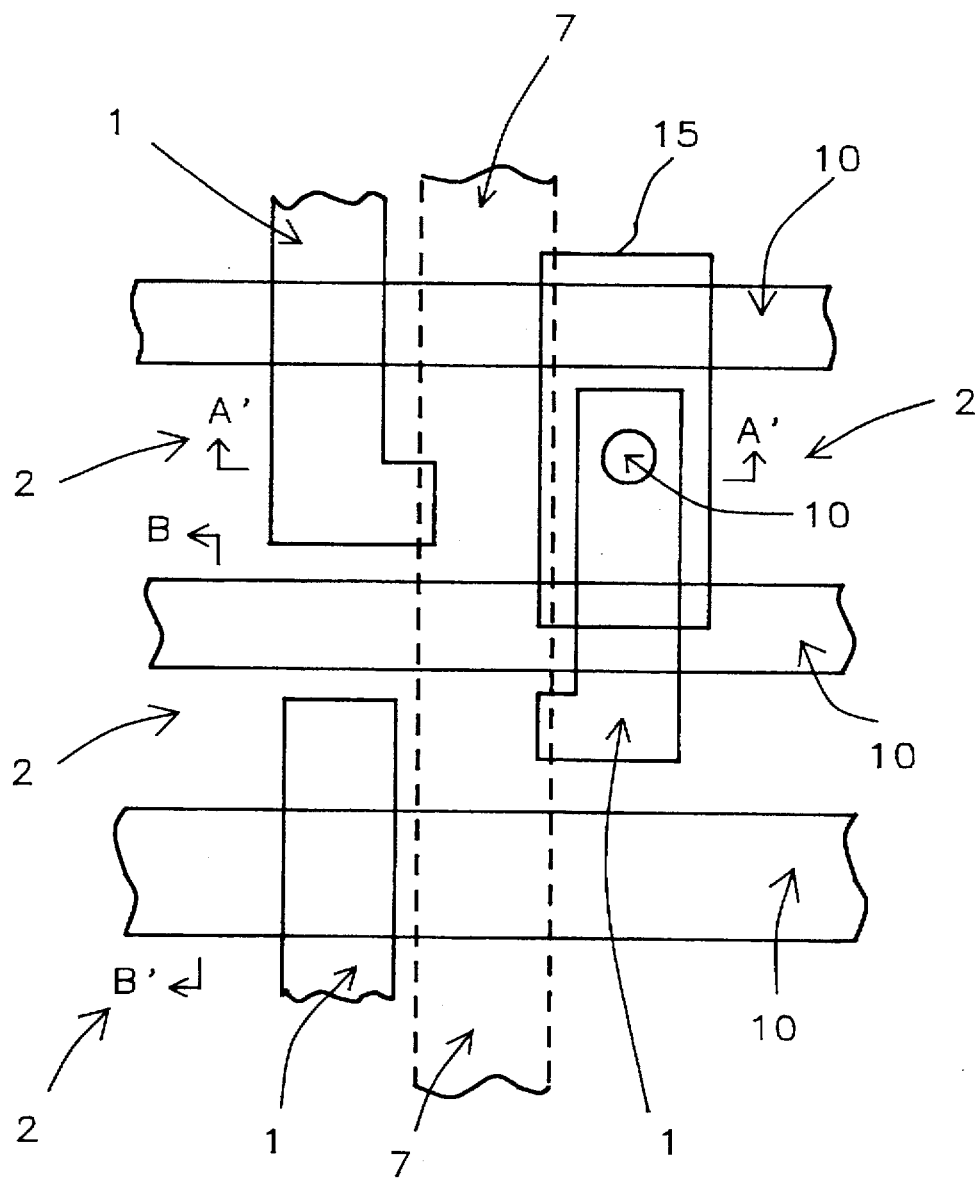
FIG. 1, which schematically presents a top view of the memory cell, with a buried bit line, self-aligned to the source and drain region of a transfer gate transistor.

The method of creating a memory cell, with a buried bit line, self-aligned to a source and drain region of a transfer gate transistor, will now be described. FIG. 1, schematically shows a top view of the memory cell, featuring the self-aligned, buried bit line. Regions of isolation, comprised of insulator filled, shallows trenches, 2, surround non-isolated, semiconductor substrate surface, 1. A buried bit line, 7, is shown below the insulator filled, shallow trenches, 2. Polysilicon gate structures, 10, are shown, normal to buried bit lines, 7, and intersecting the active device region of semiconductor substrate, 1. A contact hole, 10, used as the via for storage node structure, 15, is also included in the top view of the memory cell, in FIG. 1.

Figure 2A:
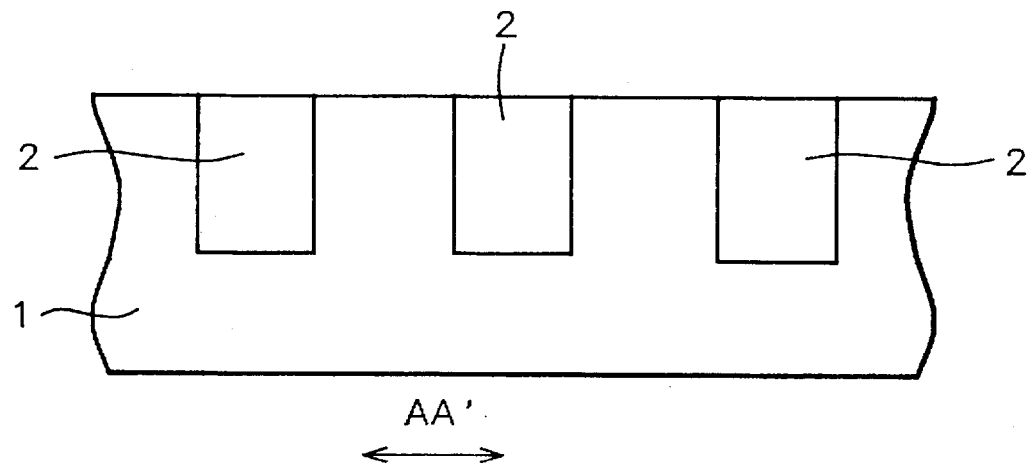

The fabrication sequence for this memory cell, begins with FIG. 2a, schematically showing cross-sectional views along the AA' direction. A semiconductor substrate, 1, comprised of single crystalline silicon, with a <100> crystallographic orientation, is used. A thin silicon oxide layer, not shown in FIG. 2a, is grown, followed by photolithographic and dry etching procedures, using $CHF_3$ as an etchant for the thin silicon oxide layer, and using $Cl_2$ as an etchant for semiconductor substrate, 1, creating shallow trenches, in semiconductor substrate, 1, to a depth between about 4000 to 6000 Angstroms, and with a nominal trench width, and with a nominal space between trenches, that is allowable in the design rules. A low pressure chemical vapor deposition, (LPCVD), or a plasma enhanced chemical vapor deposition, (PECVD), procedure is next used, at a temperature between about 300° to 7000° C., to a thickness equal to about two-thirds the value of the trench width, to completely fill the shallow trenches, with silicon oxide, and with this same silicon oxide layer also depositing on the exposed surface between shallow trenches. Unwanted silicon oxide is then removed from regions between the shallow trenches, via either a chemical mechanical polishing, (CMP), procedure, or via a selective, anisotropic, reactive ion etching, (RIE), procedure, using $CHF_3$ as an etchant, resulting in insulator filled, shallow trench, 2, schematically shown in FIG. 2a. The thin silicon oxide layer, previously used, along with a photoresist shape, to define the shallow trench in semiconductor substrate, 1, is also removed during the CMP, or RIE removal of the silicon oxide material, used for shallow trench filling.

Figure 3A:
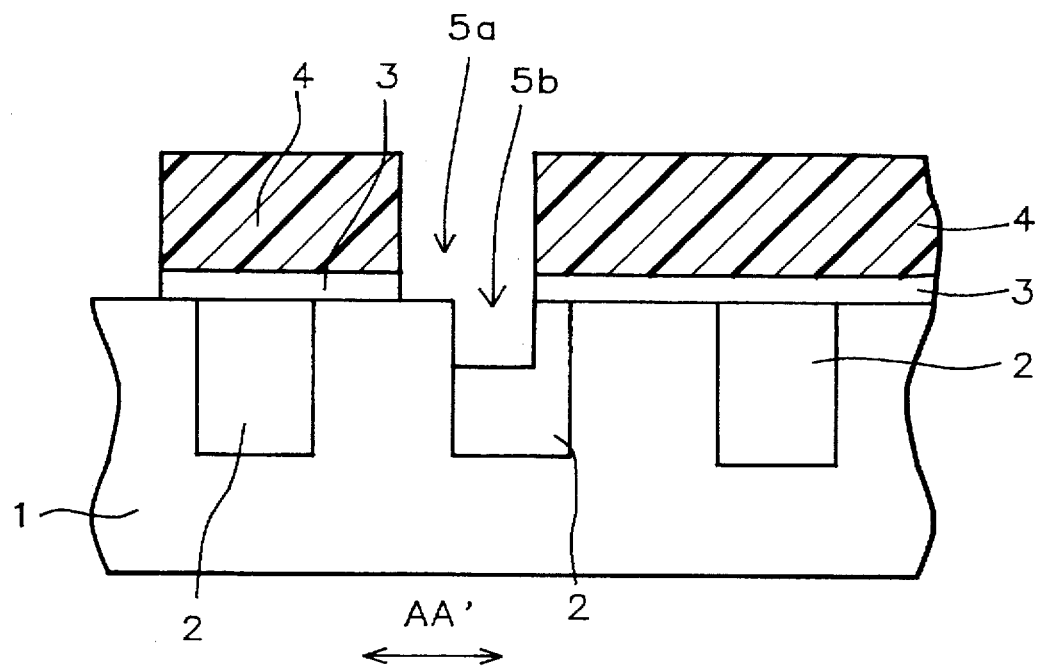

A silicon oxide layer, 3, is next grown, via either LPCVD, PECVD, or thermal oxidation procedures, to a thickness between about 500 to 1000 Angstroms. A photoresist shape, 4, is formed and used as a mask to allow a RIE procedure, using $CHF_3$ as an etchant, to define opening, 5a, shown schematically in FIG. 3a. The RIE procedure, using $CHF_3$ as an etchant, is extended to allow selective removal of exposed silicon oxide, in the shallow trench, while not etching semiconductor substrate, 1, creating a notch, 5b, in the corner of insulator filled, shallow trench, 2. The absence of silicon oxide in the corner of the insulator filled, shallow trench, 2, or notch, 5b, will subsequently allow the buried bit line to reside in this space. The depth of notch, 5b, extends to between about 2500 to 3500 Angstroms below the top surface of the insulator filled, shallow trench, leaving between 1500 to 2500 Angstroms of silicon oxide in the region underlying notch, 5b. Photoresist removal is accomplished via plasma oxygen ashing and careful wet cleans.

Figure 4A:
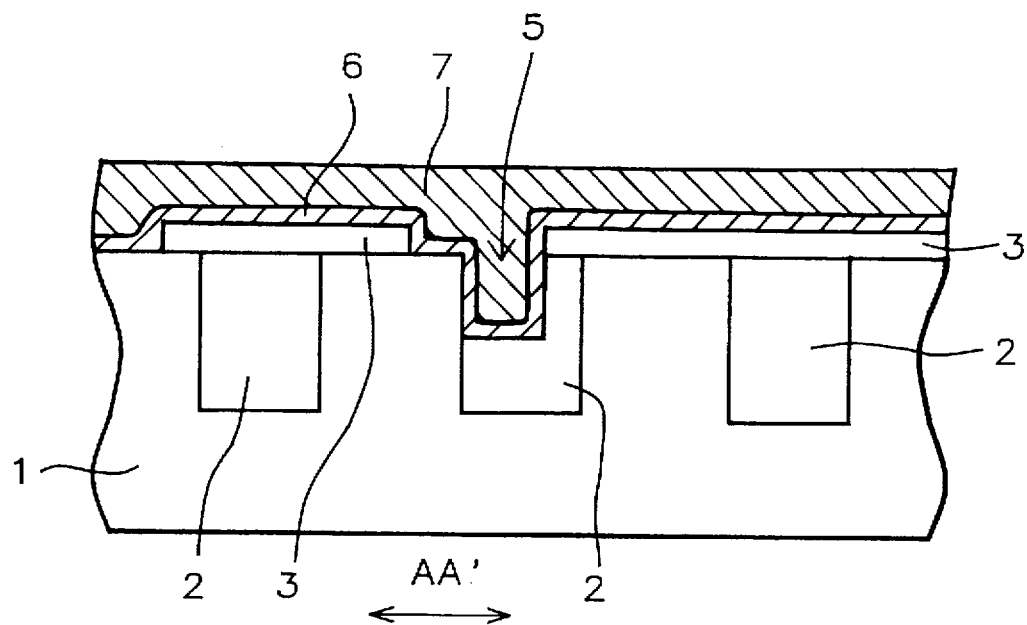

A thin layer of doped polysilicon, 6, is next deposited using in situ doping techniques. Doped polysilicon layer, 6, shown schematically in FIG. 4b, is deposited using LPCVD procedures, at a temperature between about 550° to 650° C., to a thickness between about 250 to 350 Angstroms, using silane, with the addition of either phosphine or arsine, for doping purposes. A overlying conductive layer, 7, is next deposited and shown schematically in FIG. 4b. Conductive layer, 7, can be tungsten, deposited using LPCVD procedures, at a temperature between about 600° to 800° C., to a thickness between about 1500 to 2500 Angstroms, using tungsten hexafluoride as a source. If tungsten is used as conductive layer, 7, an underlying barrier layer of titanium nitride, is first deposited to prevent the underlying doped polysilicon layer, 6, from being attacked by the by-products of the tungsten deposition. Conductive layer, 7, can also be tungsten silicide, again deposited using LPCVD procedures, at a temperature between about 600° to 800° C., to a thickness between about 1500 to 2500 Angstroms, using tungsten hexafluoride and silane as the source.

Figure 5A:
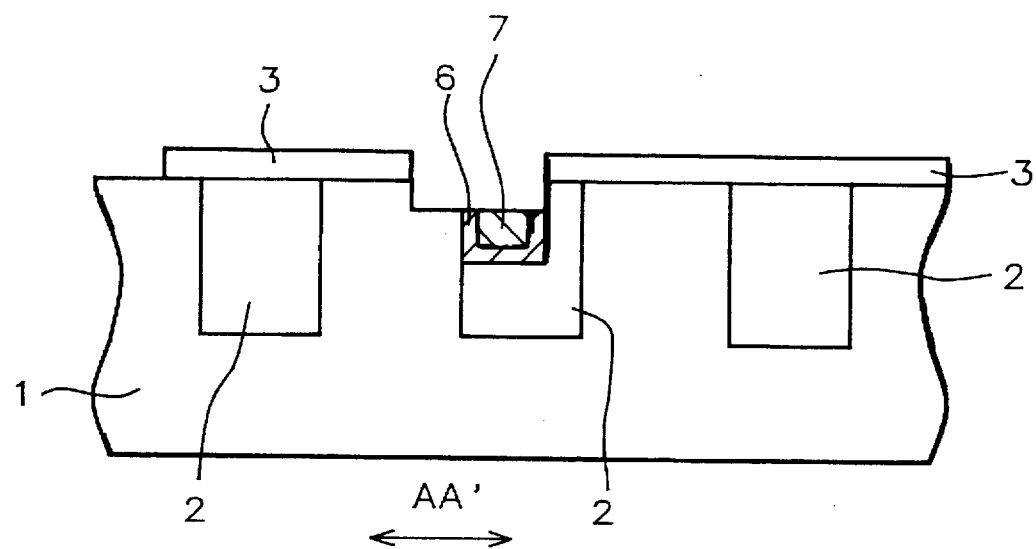

Conductive layer, 7, and doped polysilicon layer, 6, are then etched back, via RIE procedures, using $Cl_2$ as an etchant, exposing the top surface of silicon oxide layer, 3. The etching procedure is then continued to recess conductive layer, 7, and doped polysilicon layer, 6, as well as exposed semiconductor substrate, 1, not protected by silicon oxide layer, 3, to a level between 1000 to 2000 Angstroms below the top surface of semiconductor substrate, 1, leaving a plug of conductive layer, 7, and doped polysilicon layer, 6, between about 1500 to 2500 Angstroms in thickness, in the corner of the insulator filled, shallow trench, 2. This plug of conductive layer, 7, and doped polysilicon layer, 6, embedded, and recessed, in the corner of the insulator filled, shallow trench, will serve as the bit line, subsequently to be covered with insulator, and thus function as a buried bit line. This is schematically shown in FIG. 5a.

Figure 6A:
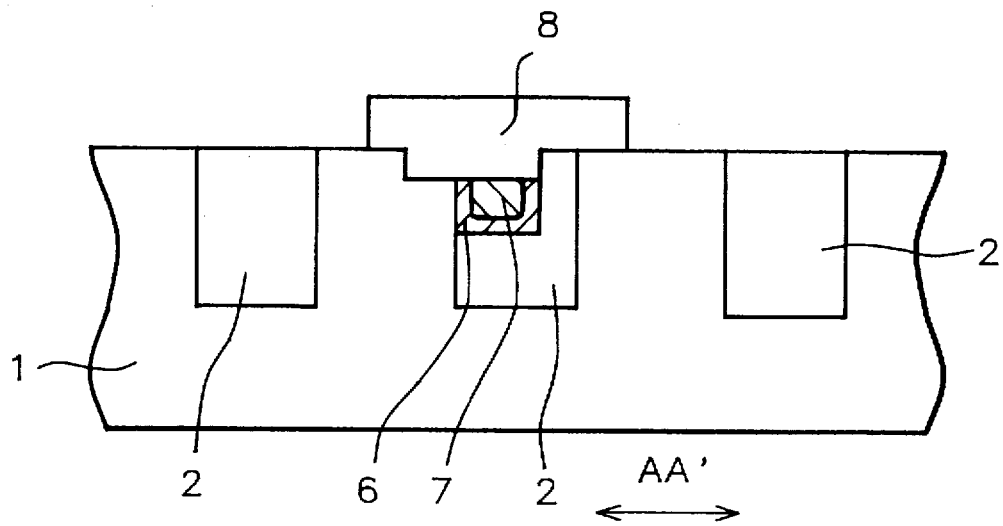

Removal of silicon oxide layer, 3, is followed by the LPCVD or PECVD deposition of another silicon oxide layer, at a temperature between about 300° to 700° C., to a thickness between about 2000 to 3000 Angstroms. Photolithographic and dry etching procedures, using $CHF_3$ as an etchant, are next used to create silicon oxide shape, 8, shown schematically in FIG. 6a. Silicon oxide shape, 8, completely embeds the conductive plug of conductive layer, 7, and doped polysilicon layer, 6, creating the buried bit line. Photoresist removal is again accomplished via plasma oxygen ashing.

Figure 7A:
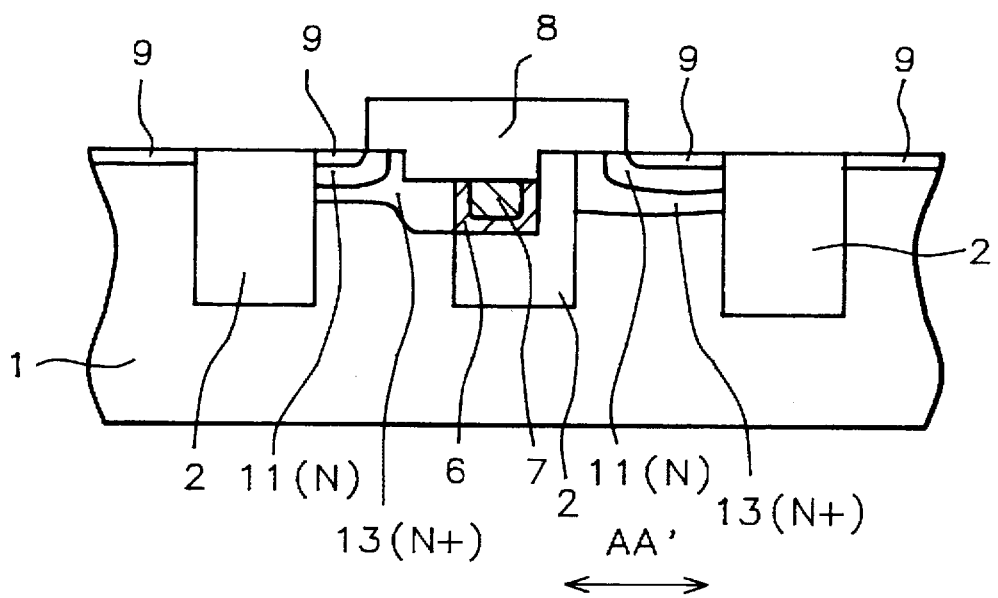
Figure 7B:
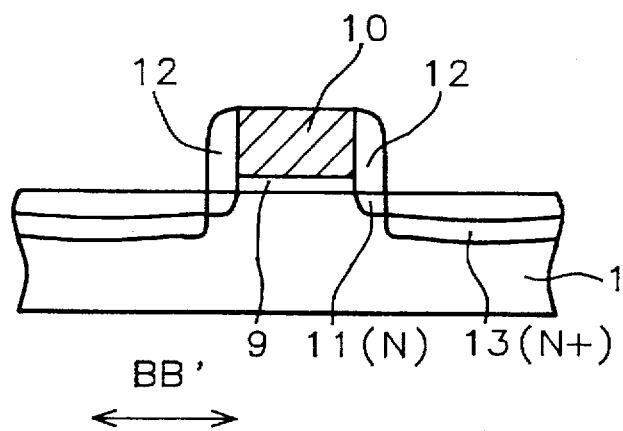
FIG. 7b, which in cross-sectional style, for another specific direction of the memory cell, along the BB' axis, illustrates a key fabrication stage of the transfer gate transistor.

FIG. 7b, schematically shows a cross-sectional view of the memory cell in the BB' direction. A thin gate insulator layer, 9, of silicon dioxide, is grown at a temperature between about 850° to 950° C., in an oxygen - steam ambient,to a thickness between about 50 to 200 Angstroms. A polysilicon layer is next deposited using LPCVD procedures, at a temperature between about 550° to 650° C., to a thickness between about 2000 to 4000 Angstroms. This polysilicon layer can be deposited intrinsically and doped via ion implantation of either arsenic or phosphorous, at an energy between about 25 to 100 KeV, at a dose between about 1E14 to 1E16 atoms/cm². The polysilicon layer can also be deposited using in situ doping procedures, via the incorporation of either phosphine or arsine, into a silane ambient. Photolithographic and dry etching procedures, using $Cl_2$ as an etchant, are used to create polysilicon gate structure, or word line, 10, shown schematically in FIG. 7b. Word line, 10, is placed normal to buried bit line, 7. This is shown in the top view of the memory cell, previously described in FIG. 1. After photoresist removal, via plasma oxygen ashing and careful wet cleans, a lightly doped source and drain region, 11, is formed in regions of exposed semiconductor substrate, 1, not covered by word line, 10. The lightly doped source and drain regions are formed via ion implantation of phosphorous, at an energy between about 30 to 75 KeV, at a dose between about 1E12 to 1E14 atoms/cm². Another silicon oxide layer is next deposited, using LPCVD or PECVD procedures, at a temperature between about 300° to 700° C., to a thickness between about 1500 to 3000 Angstroms, followed by an anisotropic RIE procedure, using $CHF_3$ as an etchant, creating silicon oxide spacers, 12, on the sides of word line, 10. A heavily doped source and drain region, 13, is then formed via ion implantation of arsenic or phosphorous, at an energy between about 50 to 100 KeV, at a dose between about 1E14 to 1E16 atoms/cm².

FIG. 7a, again schematically shows the memory cell along the AA' direction, after being subjected to both the lightly doped, and heavily doped, source and drain regions, using the conditions that were previously described for FIG. 7b. It can be seen that lightly doped source and drain region, 11, as well as heavily doped source and drain region, 13, were created in regions of semiconductor substrate, 1, not covered by silicon oxide shape, 8. A rapid thermal anneal, at a temperature between about 950° to 1050° C., for a time between about 10 to 60 sec, is used to activate the dopants in the source and drain regions, while also allowing dopants from doped polysilicon layer, 6, embedded in insulator filled, shallow trench, 2, to out-diffuse and connect, and contact, heavily doped source and drain region, 13. This phenomena results in self-alignment of the embedded, or buried bit line, comprised of conductive layer, 7, and doped polysilicon layer, 6, to the heavily doped source and drain region of the transfer gate transistor. In addition the contact between the buried bit line and the active device region is accomplished using the vertical sidewalls of the buried bit line, eliminating a photolithographic procedure, thus enabling the self-alignment to occur, independent of photolithographic design rules.

Figure 8A:
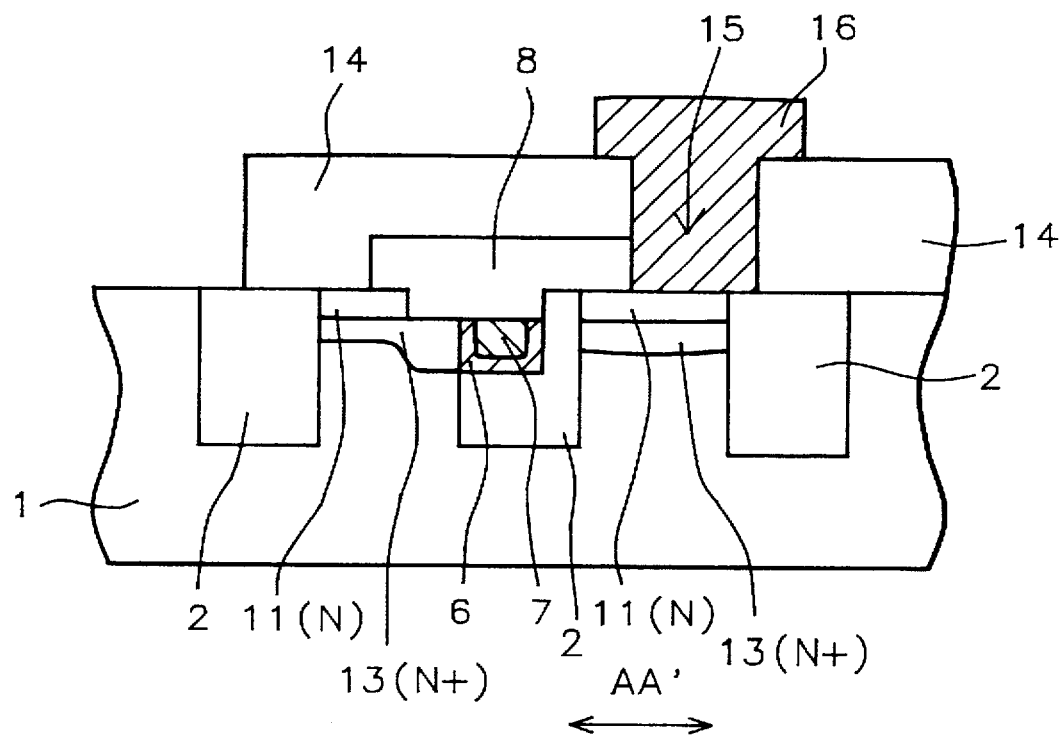

Another silicon oxide layer, 14, is deposited using PECVD procedures, at a temperature between about 300° to 500° C. Photolithographic and RIE procedures, using $CHF_3$ as an etchant, are used to open a capacitor contact hole, 15, in silicon oxide layer, 14, exposing the top surface of heavily doped source and drain region, 13. This is shown schematically in FIG. 8a. After photoresist removal, via plasma oxygen ashing and careful wet cleans, a polysilicon layer is deposited, using LPCVD procedures, at a temperature between about 550° to 650° C., to a thickness between about 5000 to 8000 Angstroms. This polysilicon can either be deposited intrinsically and doped via subsequent ion implantation of arsenic or phosphorus, at an energy between about 25 to 75 KeV, at a dose between about 1E16 to 5E16 atoms/cm², or the polysilicon layer can be grown using in situ doping procedures, incorporating either arsine or phosphine, into a silane ambient. Photolithographic and RIE procedures, using $Cl_2$ as an etchant, are used to pattern the polysilicon layer and create the storage node electrode, 16, for the subsequent STC structure. Photoresist removal is again performed using plasma oxygen ashing and careful wet cleans. The result of these steps are schematically shown in FIG. 8a.

Figure 9A:
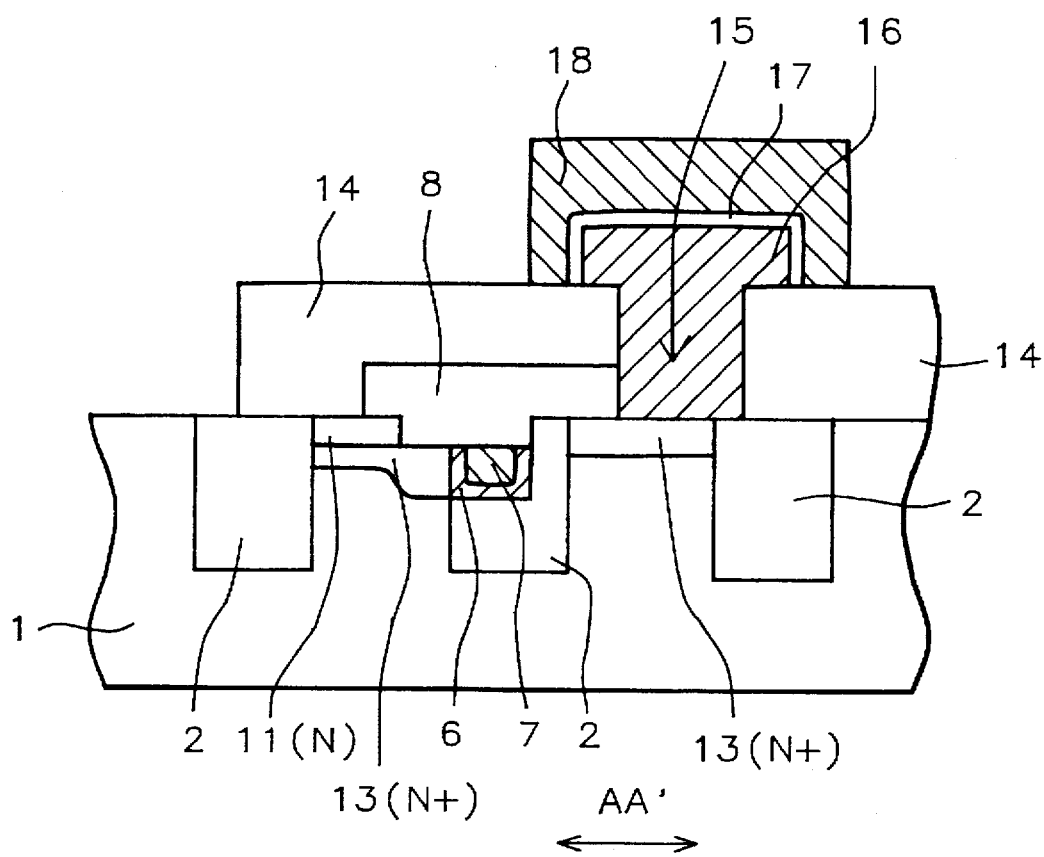

FIG. 9a, schematically shows the completion of the STC structure, use for the memory cell, with the buried bit line. First a dielectric layer, 17, is formed, overlying the storage node electrode, 17. Dielectric layer, 17, can be an insulator layer possessing a high dielectric constant, such as $Ta_2O_5$, obtained via r.f sputtering techniques, to a thickness between about 200 to 300 Angstroms. Dielectric layer, 17, can also be ONO, (Oxidized—silicon Nitride—silicon Oxide). The ONO layer is formed by initially growing a silicon dioxide layer, between about 10 to 50 Angstroms, followed by the deposition of a silicon nitride layer, between about 10 to 20 Angstroms. Subsequent thermal oxidation of the silicon nitride layer results in the formation of a silicon oxynitride layer on silicon oxide, at a silicon oxide equivalent thickness of between about 40 to 80 Angstroms. Finally another layer of polysilicon is deposited, via LPCVD procedures, at a temperature between about 550° to 6500° C., to a thickness between about 2000 to 3000 Angstroms. Doping of this polysilicon layer is accomplished via in situ doping, deposition procedures, via the addition of $PH_3$ to a silane ambient. Photolithographic and RIE procedures, using $Cl_2$ as an etchant, are next employed to create polysilicon upper electrode, or plate electrode, 18, shown schematically in FIG. 9a. Photoresist is again removed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a memory cell, on a semiconductor substrate, comprised of a buried bit line, embedded in an insulator filled, shallow trench, with said buried bit line self-aligned to an adjacent source and drain region, of a transfer gate transistor, and with a stacked capacitor structure, overlying said transfer gate transistor, comprising the steps of:

forming shallow trenches in said semiconductor substrate;

depositing a first insulator layer, on top surface of said semiconductor substrate, including complete filling of said shallow trenches with said first insulator layer;

removal of said first insulator layer from top surface of said semiconductor substrate, resulting in insulator filled, shallow trenches;

depositing a second insulator layer on said insulator filled, shallow trenches, and on top surface of said semiconductor substrate, exposed between said insulator filled, shallow trenches;

forming an opening in said second insulator layer, exposing the top surface, of a corner of said insulator filled, shallow trench, and also exposing a portion of a top surface of said semiconductor substrate;

removal of said first insulator layer, from said exposed corner, of said insulator filled, shallow trench, creating a notch in the said corner, of said insulator filled, shallow trench;

depositing a doped polysilicon layer on the top surface of second insulator layer, on the surface of said notch, in the corner of said insulator filled, shallow trench, and on said exposed portion of top surface of said semiconductor substrate;

depositing a conductive layer on said doped polysilicon layer, completely filling said notch;

removal of said conductive layer, and of said doped polysilicon layer, from the top surface of said second insulator layer;

recessing of said conductive layer, and of said doped polysilicon layer, in said notch, to create a bit line in bottom portion of said notch;

depositing a third insulator layer on said bit line, in bottom portion of said notch, on top surface of said insulator filled, shallow trenches, and on top surface of said semiconductor substrate, between said insulator filled, shallow trenches;

patterning of said third insulator layer, to form an insulator shape, completely overlying said bit line, in bottom portion of said notch, resulting in said buried bit line;

growing a gate insulator layer, on said semiconductor substrate;

forming polysilicon gate structures, on said gate insulator layer, in an area of said memory cell, to be used for said transfer gate transistor;

forming lightly doped source and drain regions in said semiconductor substrate, in regions not covered by said polysilicon gate structures, in the area of said memory cell to be used for said transfer gate transistors, and also forming said lightly doped source and drain regions in areas of said memory cell to be used for self-aligned buried bit lines, in areas not covered with said insulator shape, or insulator filled, shallow trenches;

forming insulator spacers on the sides of said polysilicon gate structures;

forming heavily doped source and drain regions in said semiconductor substrate, in regions not covered by said polysilicon gate structures, or by said insulator spacers on the sides of said polysilicon gate structures, in the area of said memory cell to be used for said transfer gate transistor, and also forming said heavily doped source and drain regions in areas of said memory cell to be used for self-aligned, buried bit lines, in regions not covered with said insulator shape, or insulator filled, shallow trenches;

annealing to activate dopants in said lightly doped source and drain region, and in said heavily doped source and drain region, and also allowing dopants to out-diffuse from said doped polysilicon layer, in bottom portion of said notch, and to connect with said heavily doped source and drain region of said transfer gate transistor, providing contact, and self alignment, between said heavily doped source and drain region, and said buried bit line, embedded in insulator, in bottom portion of said notch;

depositing a fourth insulator layer;

opening a capacitor contact hole in said fourth insulator layer, exposing the top surface of said heavily doped source and drain region;

depositing a first polysilicon capacitor layer on top surface of said fourth insulator layer, and on top surface of said heavily doped source and drain region, exposed in said capacitor contact hole;

patterning of said first polysilicon capacitor layer to form a storage node electrode, for said stacked capacitor structure;

forming a dielectric layer on said storage node electrode;

depositing a second polysilicon capacitor layer on said dielectric layer; and patterning of said second polysilicon capacitor layer to form said plate electrode for said stacked capacitor structure.

2. The method of claim 1, wherein said shallow trench is formed in said semiconductor substrate, via anisotropic RIE, using $Cl_2$ as an etchant, with said shallow trench having a depth between about 4000 to 6000 Angstroms, with a nominal width, and with nominal spaces between said shallow trenches, allowable in the design rule used.

3. The method of claim 1, wherein said first insulator layer, used to fill said shallow trenches, is silicon oxide, deposited using LPCVD or PECVD procedures, at a temperature between about 300° to 700° C., to a thickness equal to about two-thirds of the trench width.

4. The method of claim 1, wherein said notch, in insulator filled, shallow trenches, is formed via anisotropic, RIE procedures, using $CHF_3$ as an etchant, with said notch extending between about 2500 to 3500 Angstroms below the top surface of said insulator filled, shallow trenches.

5. The method of claim 1, wherein said doped polysilicon layer is deposited, using LPCVD procedures, including in-situ doping, at a temperature between about 550° to 650° C., to a thickness between about 250 to 350 Angstroms, using silane as a source, with the addition of either arsine or phosphine.

6. The method of claim 1, wherein said conductive layer is tungsten, deposited using LPCVD procedures, at a temperature between about 600° to 800° C., to a thickness between about 1500 to 2500 Angstroms, using tungsten hexafluoride as a source.

7. The method of claim 1, wherein said conductive layer is tungsten silicide, deposited using LPCVD procedures, at a temperature between about 600° to 800° C., to a thickness between about 1500 to 2500 Angstroms, using tungsten hexafluoride and silane as sources.

8. The method of claim 1, wherein bit line, comprised of said conductive layer, and of said doped polysilicon layer, is recessed in said notch, in said insulator filled, shallow trench, via anisotropic RIE procedures, using $Cl_2$ as an etchant, and with said bit line being between about 1500 to 2500 Angstroms in thickness, and recessed in said notch to a level between about 1000 to 2000 Angstroms below the top surface of said insulator filled, shallow trenches.

9. The method of claim 1, wherein space in said notch, in said insulator filled, shallow trenches, not filled with recessed, said bit line, is filled with said third insulator layer of silicon oxide, deposited using either LPCVD or PECVD procedures, at a temperature between about 300° to 700° C., to a thickness between about 2000 to 3000 Angstroms.

10. The method of claim 1, wherein said gate insulator layer is silicon dioxide, thermally grown in an oxygen-steam ambient, at a temperature between about 850° to 950° C., to a thickness between about 50 to 200 Angstroms.

11. The method of claim 1, wherein said heavily doped source and drain regions are formed via ion implantation of arsenic or phosphorous, at an energy between about 50 to 100 KeV, at a dose between about 1E14 to 1E16 atoms/cm².

12. The method of claim 1, wherein said RTA procedure, used to connect, and self-align, said heavily doped source and drain region, to said buried bit line, via outdiffusion from said doped polysilicon layer, of said buried bit line, is performed at a temperature between about 950° to 1050° C., for a time between about 10 to 60 sec.

13. The method of claim 1, wherein said dielectric layer is ONO, at an equivalent silicon dioxide thickness between about 40 to 80 Angstroms, created by an initial thermal oxidation to form a silicon oxide layer, between about 10 to 50 Angstroms, followed by a deposition of silicon nitride, to a thickness between about 10 to 20 Angstroms, and thermal oxidation of said silicon nitride layer, creating a silicon oxynitride layer, on the underlying, said silicon oxide layer.

14. The method of claim 1, wherein said dielectric layer is $Ta_2O_5$, obtained via r.f. sputtering techniques, at a thickness between about 200 to 300 Angstroms.

15. A method for forming a buried bit line, for a memory cell, in a semiconductor substrate, with said buried bit line, self-aligned to an adjacent source and drain region of a transfer gate transistor, comprising the steps of;

forming insulator filled, shallow trenches, in semiconductor substrate;

creating a notch in a corner of said insulator filled, shallow trench, by removal of a portion of insulator layer, in a corner of said insulator filled, shallow trench;

depositing a doped polysilicon layer, covering the surface of said notch, in corner of said insulator filled, shallow trench;

depositing a conductive layer on said doped polysilicon layer, completely filling said notch, in corner of said insulator filled, shallow trench;

etching back of said conductive layer, and of said doped polysilicon layer, to create a plug of said conductive layer, and of said doped polysilicon layer, in said notch, and then recessing said plug, in said notch, by removing top portion of said plug, to form a bit line of said conductive layer, and said doped polysilicon layer, recessed in said notch;

forming an insulator shape overlying said bit line, recessed in said notch, resulting in said buried bit line;

forming source and drain regions in said semiconductor substrate; and annealing to out-diffuse dopant from said doped polysilicon layer to connect, and self-align, said buried bit line, to said source and drain region.

16. The method of claim 15, wherein shallow trenches are formed in said semiconductor substrate, via anisotropic RIE procedures, using $Cl_2$ as an etchant, to a depth between about 4000 to 6000 Angstroms, with a nominal width, and with a nominal space between shallow trenches, allowable in the design rules.

17. The method of claim 15, wherein insulator layer in shallow trenches is silicon oxide, deposited using LPCVD or PECVD procedures, at a temperature between about 300° to 700° C., to a thickness equal to about two-thirds the thickness of the shallow trench width.

18. The method of claim 15, wherein said notch, in the corner of said insulator filled, shallow trench, is formed via anisotropic RIE procedures, using $CHF_3$ as an etchant, with said notch extending between about 2500 to 3500 Angstroms below the top surface of said insulator filled trenches.

19. The method of claim 15, wherein said doped polysilicon layer is deposited using LPCVD procedures, at a temperature between about 550° to 650° C., to a thickness between about 250 to 350 Angstroms, using silane as a source, with the addition of either arsine or phosphine for doping purposes.

20. The method of claim 15, wherein said conductive layer is tungsten, deposited using LPCVD procedures, at a temperature between about 600° to 800° C., to a thickness between about 1500 to 2500 Angstroms, using tungsten hexafluoride as a source.

21. The method of claim 15, wherein said conductive layer is tungsten silicide, deposited using LPCVD procedures, at a temperature between about 600° to 800° C., to a thickness between about 1500 to 2500 Angstroms, using tungsten hexafluoride and silane as sources.

22. The method of claim 15, wherein said bit line, comprised of said conductive layer, and of said doped polysilicon layer, is formed to a thickness between about 1500 to 2500 Angstroms, and is recessed in said notch, to a level between about 1000 to 2000 Angstroms below the top surface of said insulator filled, shallow trenches, via anisotropic, RIE procedures, using $Cl_2$ as an etchant.

23. The method of claim 15, wherein the space in said notch, overlying recessed, said bit line, is completely filled with an insulator layer of silicon oxide, deposited using either LPCVD or PECVD procedures, at a temperature between about 300° to 700° C., to a thickness between about 2000 to 3000 Angstroms.

24. The method of claim 15, wherein said source and drain region, of said transfer gate transistor, is formed via ion implantation of either arsenic or phosphorous, at an energy between about 50 to 100 KeV, at a dose between about 1E14 to 1E16 atoms/$cm^2$.

25. The method of claim 15, wherein RTA procedure, used to connect, and self-align, said buried bit line, to said source and drain region, of said transfer gate transistor, is performed at a temperature between about 950° to 1050° C., for a time between about 10 to 60 sec.

* * * * *